United States Patent
Maxwell

(10) Patent No.: US 7,138,830 B2
(45) Date of Patent: Nov. 21, 2006

(54) SUPPLY ENABLED OPTIMIZATION OUTPUT BUFFER

(75) Inventor: Christopher T. Maxwell, Sherman, TX (US)

(73) Assignee: Texas Instrument Incorporated, Dallas, TX (US)

(*) Notice: Subject to any disclaimer, the term of this patent is extended or adjusted under 35 U.S.C. 154(b) by 63 days.

(21) Appl. No.: 11/025,455

(22) Filed: Dec. 29, 2004

(65) Prior Publication Data

US 2006/0139058 A1 Jun. 29, 2006

(51) Int. Cl.
 *H03K 19/00* (2006.01)
(52) U.S. Cl. .......................... 326/56; 326/57; 326/81; 326/87
(58) Field of Classification Search ............ 326/56–58, 326/26–27, 68, 80–81, 87; 327/108–112
See application file for complete search history.

(56) References Cited

U.S. PATENT DOCUMENTS 4,855,623 A * 8/1989 Flaherty ...................... 326/87
5,929,668 A * 7/1999 Kim ............................ 327/112

* cited by examiner

*Primary Examiner*—Anh Q. Tran
(74) *Attorney, Agent, or Firm*—J. Dennis Moore; W. James Brady; Frederick J. Telecky, Jr.

(57) ABSTRACT

An output buffer having a first pull-up transistor and a first pull-down transistor connected in series between two nodes of a power supply, their common connection node being connected to the output node. A logic circuit receives an input signal at a logic level and controls the voltage at the gates of the first pull-up transistor and the first pull-down transistor to provide the logic level at the output node. A second pull-up transistor and a second pull-down transistor are connected in series between the two nodes of the power supply, their common connection node being connected to the output node. A control circuit provides an output indicating when the supply voltage is below a predetermined level. A control circuit is responsive to the output of the control circuit to control the voltage at the gates of the second pull-up transistor and the second pull-down transistor to provide the logic level at the output node only when the output of the control circuit indicates when the supply voltage is below the predetermined level.

1 Claim, 2 Drawing Sheets

SUPPLY ENABLED OPTIMIZATION OUTPUT BUFFER

TECHNICAL FIELD OF THE INVENTION

The present invention relates to integrated circuits, and more particularly relates to general purpose output buffers.

BACKGROUND OF THE INVENTION

In an integrated circuit chip, signals are transferred out of the circuit by output buffers, configured as part of the integrated circuit on the chip. General purpose output buffers generally perform relatively standard functions that are useful on all outputs, such as isolation of the integrated circuit from the load it is driving and the provision of sufficient power in the driving of the output signal to maintain circuit performance, even when the load includes significant capacitance. In other words, for circuits driving loads with a high capacitance, such as a system bus, for example, the general purpose output buffer is intended to provide sufficient power to charge up that capacitance quickly enough to effectively deliver the output signal to the load within a short enough time interval considered acceptable for the integrated circuit's intended function.

The design of general purpose output buffers for a given integrated circuit is typically optimized for a single supply voltage, for example $V_{CC}=3.3$ V. This is because the entire integrated circuit is generally intended to run at a given supply voltage. However, the supply voltage for a given integrated circuit may not be the same from chip to chip, because of variations in the manufacturing process for the chip. Unfortunately, the circuit performance tends to depend upon the supply voltage, so that chips having higher supply voltages perform better than necessary, while chips having lower supply voltages perform more poorly than desired. The problem may be addressed by designing the output buffer with larger transistor devices, ensuring adequate performance at supply voltages at the lowest end of the expected range of variation of the supply voltage. However, for chips having a supply voltage at higher supply voltages their output buffers will draw excessive current because of the larger transistor devices, and therefore may dissipate excessive power.

SUMMARY OF THE INVENTION

It would therefore be desirable to have a general purpose output buffer that provides improved performance that is maintained, even when the supply voltage is at the low end of its range of variation. The present invention provides such an output buffer. It has a first pull-up transistor and a first pull-down transistor connected in series between two nodes of a power supply, their common connection node being connected to the output node. A logic circuit receives an input signal at a logic level and controls the voltage at the gates of the first pull-up transistor and the first pull-down transistor to provide the logic level at the output node. A second pull-up transistor and a second pull-down transistor are connected in series between the two nodes of the power supply, their common connection node being connected to the output node. A control circuit provides an output indicating when the supply voltage is below a predetermined level. A control circuit is responsive to the output of the control circuit to control the voltage at the gates of the second pull-up transistor and the second pull-down transistor to provide the logic level at the output node only when the output of the control circuit indicates when the supply voltage is below the predetermined level.

These and other aspects and features of the invention will be apparent to those skilled in the art from the following detailed description of the invention, taken together with the accompanying drawings.

DETAILED DESCRIPTION OF THE PREFERRED EMBODIMENT

Figure 1:
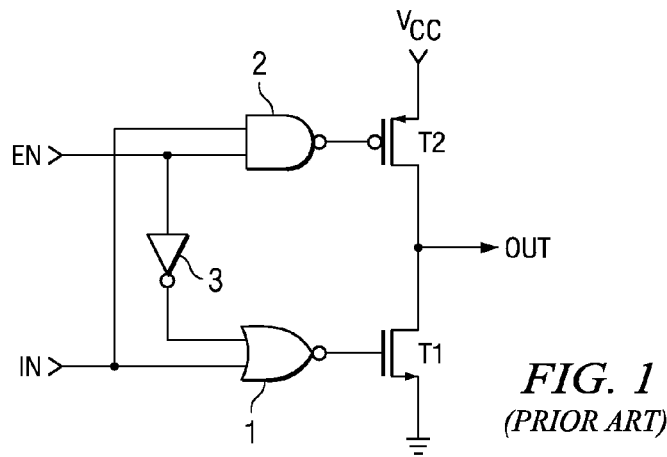
FIG. 1 is a circuit diagram of a typical prior art general purpose output buffer.

FIG. 1 is a circuit diagram of a typical prior art general purpose output buffer. An enable signal EN and an input signal IN are provided as inputs, and an output signal OUT is provided as an output. An NMOS driver transistor T1 and a PMOS driver transistor T2 are connected in series between a power supply having a voltage $V_{CC}$ and ground, as shown. A NOR gate 1, a NAND gate 2 and an inverter 3 are interconnected as shown, and operate in conjunction with signal EN to provide an enable function for the circuit. When the circuit is enabled, a HIGH value of IN causes transistor T2 to turn on and transistor T1 to turn off, thus driving a HIGH value of OUT at the output. Conversely, when the circuit is enabled, a LOW value of IN causes transistor T1 to turn on and transistor T2 to turn off, thus driving a LOW value of OUT at the output.

In a design of a general purpose output buffer like that of FIG. 1 for a particular integrated circuit, depending on the supply voltage for the integrated circuit, the performance and power dissipation requirements for the output buffer, the size of transistors T1 and T2 is determined accordingly by the designer. For a given supply voltage, larger transistors provide increased (faster) performance at the cost of higher power dissipation, while, conversely, smaller transistors provide decreased (slower) performance with lower power dissipation. Higher or lower power supply voltage result in increased or decreased performance, respectively. Thus, to ensure at least a minimum performance, the size transistors T1 and T2 are designed to a sufficient size to ensure such performance, with the result that at higher supply voltages, increased power dissipation and unneeded speed are provided.

Figure 2:
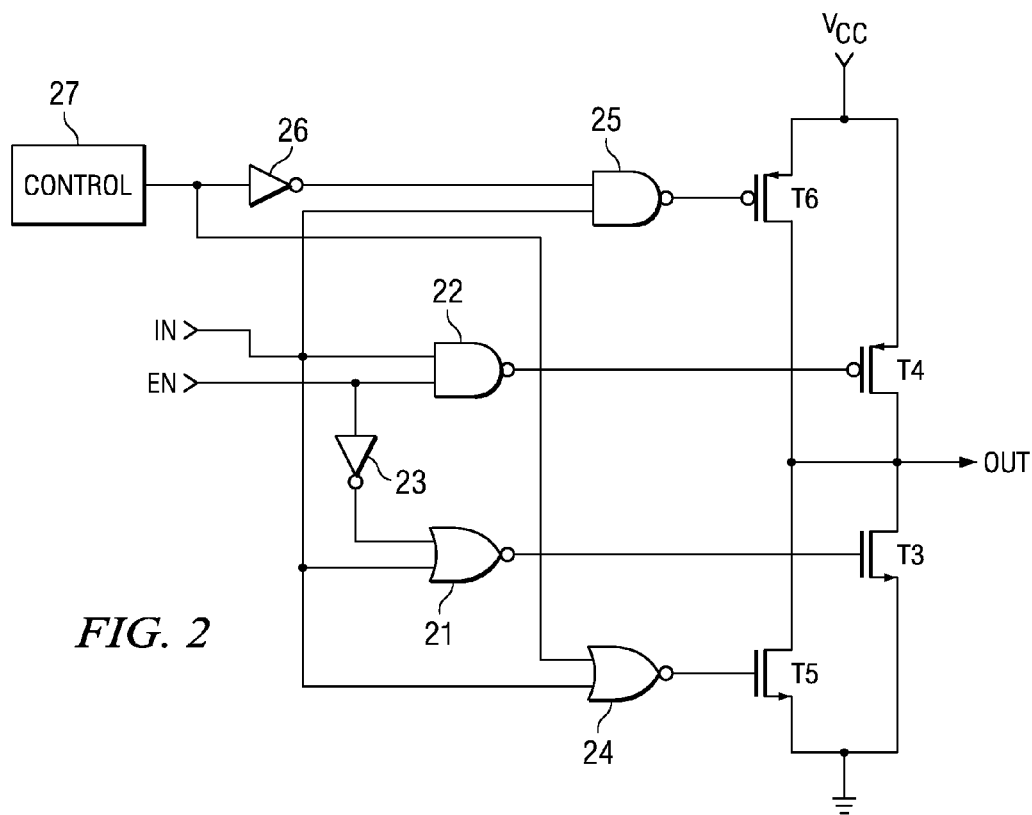
FIG. 2 is a circuit diagram of an embodiment of a general purpose output buffer according to the present invention.

FIG. 2 is a circuit diagram of an embodiment of a general purpose output buffer 20 according to the present invention. As in the buffer of FIG. 1, an enable signal EN and an input signal IN are provided as inputs, and an output signal OUT is provided as an output. An NMOS driver transistor T3 and a PMOS driver transistor T4 are connected in series between a power supply having a voltage $V_{CC}$ and ground, as shown. However, these transistors are designed to be optimized in size for operation at the high end of the range of supply voltages. A NOR gate 21, a NAND gate 22 and an inverter 23 are interconnected as shown, and operate in conjunction with signal EN to provide an enable function for the circuit. When the circuit is enabled, a HIGH value of IN causes transistor T4 to turn on and transistor T3 to turn off, thus driving a HIGH value of OUT at the output. Conversely, when the circuit is enabled, a LOW value of IN causes transistor T3 to turn on and transistor T4 to turn off, thus driving a LOW value of OUT at the output.

In addition, however, are provided an additional pair of output transistors, an NMOS transistor T5 and a PMOS transistor T6 connected in series between a power supply having a voltage $V_{CC}$ and ground, as shown. A NAND gate 25, a NOR gate 24 and an inverter 26 are interconnected as shown and to a control unit 27. The NAND gates, NOR gates and inverters of the circuit of FIG. 2 are all of standard design.

In operation, the control unit 27 provides an output signal of logic one as long as the supply voltage remains above a predetermined minimum that ensures adequate performance using only transistors T3 and T4. In this mode, NOR gate 21, NAND gate 22 and inverter 23 operate with transistors T3 and T4 in substantially the same way as NOR gate 1, NAND gate 2 and inverter 3 operate with transistors T1 and T2 in FIG. 1., while transistors T5 and T6 are held OFF.

However, when the supply voltage drops below the aforementioned predetermined minimum, the control unit 27 provides an output signal of logic zero, which enables NAND gate 25, NOR gate 24 and inverter 26 to operate with transistors T5 and T6 in substantially the same way as NAND gate 22, NOR gate 21 and inverter 23 operate with transistors T3 and T4, only with an inverted enabling signal. In this way, transistors T5 and T6 operate in parallel with transistors T3 and T4 to effectively increase the size of the output driver transistors in conditions of low power supply voltage.

It was mentioned above that transistors T3 and T4 are designed to be optimized in size for operation at the high end of the range of supply voltages. This size will depend upon the supply voltage range and other circuit considerations, and are well within the purview of those of ordinary skill in the relevant art area. Similarly, the size of T5 and T6 are designed to be optimized in size for operation in parallel with transistors T3 and T4 at the low end of the range of supply voltages. Exemplary sizes for these transistors a width of 200 microns and a length of one micron for the PMOS transistors T4 and T6, and a width of 100 microns and a length of one micron for the NMOS transistors T3 and T5. As mentioned, however, these are merely exemplary sizes, and the actual size will depend upon the supply voltage range and other circuit considerations.

Figure 3:
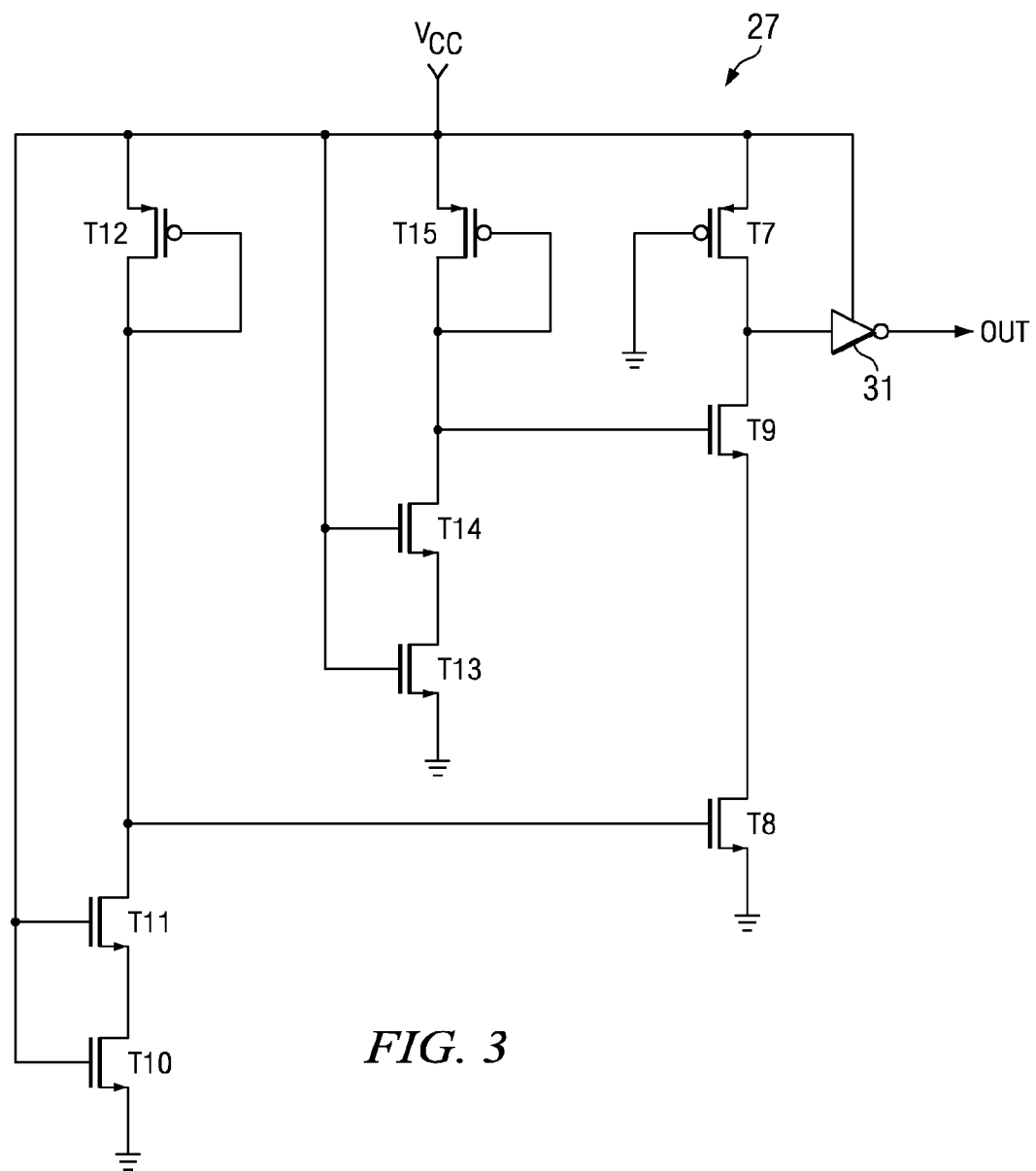
FIG. 3 is a circuit diagram of a supply voltage control circuit for the circuit of FIG. 2, according to the present invention.

FIG. 3 is a diagram of the control unit 27 of FIG. 2. It is designed to provide an output signal of logic one when the supply voltage $V_{CC}$ is above a predetermined minimum, while providing a logic zero when the supply voltage drops below the predetermined minimum. In the particular embodiment shown in FIG. 3, that predetermined minimum is approximately 2.1 V. Operating in conjunction with the circuit of FIG. 2, the design of this embodiment is optimized for operation with a supply voltage that may vary between 3.3 V and 1.6 V, while limiting the degradation in performance experienced with prior art designs.

In the circuit of FIG. 3, an inverter 31 provides the output signal for the control unit 27. A relatively small PMOS transistor T7, having its source connected to $V_{CC}$ and its gate connected to ground and its drain connected to the input of inverter 31, provides weak pull-up to the input of inverter 31. NMOS transistors T8 and T9 are connected in series between the input of inverter 31 and ground. Another relatively small PMOS transistor T12, having its source connected to $V_{CC}$ and its gate connected to its source and its drain connected to the gate of transistor T8, provides weak pull-up to the gate of transistor T8. NMOS transistors T10 and T11 are connected in series between the gate of transistor T8 and ground, with the gates of transistors T10 and T11 being connected together and to $V_{CC}$. A further relatively small PMOS transistor T15, having its source connected to $V_{CC}$ and its gate connected to its source and its drain connected to the gate of transistor T9, provides weak pull-up to the gate of transistor T9. NMOS transistors T13 and T14 are connected in series between the gate of transistor T9 and ground, with the gates of transistors T13 and T14 being connected together and to $V_{CC}$.

The circuit of FIG. 3 operates as follows. As mentioned above, transistor T7 provides a weak pull-up to the input of inverter 31. At supply voltages relatively low (i.e. threshold voltage of both NMOS & PMOS), transistors T10, T11, and T12 are OFF, thus no current exists to charge the gate of transistor T8, keeping transistor T8 OFF. Similarly, transistors T13, T14 and T15 are OFF, thus keeping transistor T9 OFF. T12 will remain OFF until the supply voltage is high enough to turn T11 and T10 ON and pull T11's source and gate low, thus allowing transistor T12 to operate in saturation region. T13 and T4 work similarly to transistors T10 and T11, and transistors T15 to T12, to control the turn-ON of transistor T9. Thus, the pull-down of transistors T8 and T9 controls the input of inverter 31, and the output of the control unit 27, i.e., of inverter 31, is logic low when transistors T8 and T9 are OFF. As the supply voltage $V_{CC}$ increases, the voltage at the gates of transistors T10 and T11 increases, as does the voltage at the gates of transistors T13 and T14. When $V_{CC}$ reaches the threshold voltage of both transistors T10 and T11, they begin to turn ON, allowing transistor T12 to start to turn ON transistor T8. The voltage at gate of T8 will be a voltage divider between the ON resistance, Ro, of transistors T10 & T11 combined and T12. In other words, $$Vg8=(Vcc*[Ro10+Ro11]/[Ro11+Ro12+Ro12]).$$

where Vg8 is the gate voltage of transistor T8, and RoN is the ON resistance of transistor TN. T8 will turn ON once Vg8 rises above the threshold voltage, Vt, of transistor T8, which is approximately 0.7 V. At this point, the drain of transistor T8 is substantially at the threshold voltage of transistor T8. Also at this point, since substantially the same process has occurred with transistors T13, T14 and T15 as occurred with transistors T10, T11 and T12, as described above, the gate of transistor T9 will be just at the threshold voltage, relative to ground, of transistor T9. When the supply voltage reaches approximately 2.1 V, and the gate to both T8 and T9 is ~0.8 V, both transistors T8 and T9 are strongly enough ON to overcome the weak pull-up of transistor T7, and the input of inverter 31 is pulled low, causing a logic one to appear at the output of control unit 27.

The circuit designer will recognize that the selection of the size of transistors T7 through T15 will determine the crossover point for the supply voltage for the output of control unit 27 to change state. Selection of these sizes is well within the scope of ordinary skill in this art area. Exemplary sizes of these transistors in a working embodiment having a crossover point of a supply voltage of 2.1 V, with units expressed in microns, are T7 width=8, length=10; T12 & T15 width=10, length=1; T8 & T9 width=80, length=1; T10 & T13 width=8, length=18; T11 & T13 width=8, length=8. In other circuit technologies and for other crossover voltages these sizes will be different.

Although the present invention and its advantages have been described in detail, it should be understood that various changes, substitutions and alterations can be made herein without departing from the spirit and scope of the invention as defined by the appended claims.

What is claimed is:

1. An output buffer having an input node and an output node, comprising:
   - a first pair of output drive transistors connected in series by their sources and drains between two nodes of a power supply providing power having a supply voltage, comprising a first pull-up transistor and a first pull-down transistor, each of the first pair of transistors having a gate, the common connection node of the first pull-up transistor and the first pull-down transistor being connected to the output node;
   - a logic circuit configured to receive an input signal at a logic level and to control the voltage at the gates of the first pull-up transistor and the first pull-down transistor to provide the logic level at the output node;
   - a second pair of output drive transistors connected in series by their sources and drains between the two nodes of the power supply, comprising a second pull-up transistor and a second pull-down transistor, each of the second pair of transistors having a gate, the common connection node of the second pull-up transistor and the second pull-down transistor being connected to the output node;
   - a first control circuit configured to provide an output having a first logic value when the supply voltage is above a predetermined level, and to provide an output having a second logic value when the supply voltage is below the predetermined level, the first control circuit comprising
     - a logic element providing the first control circuit output when a voltage at an input thereto is above a predetermined level,
     - a first PMOS transistor having a drain connected to the logic element input, a source connected to the power supply and a gate connected to ground in a weak pull-up configuration for the logic element input with respect to the power supply,
     - a first NMOS transistor and a second NMOS transistor connected in series by their sources and drains between the logic element input and ground, the drain of the first NMOS transistor being connected to the logic element input and the source of the second NMOS transistor being connected to ground,
     - a second PMOS transistor having a source connected to the power supply and a gate and a drain connected together in a weak pull-up configuration with respect to commonly connected gate and drain,
     - a third NMOS transistor and a fourth NMOS transistor connected in series by their sources and drains between the commonly connected gate and drain of the second PMOS transistor and ground, a gate of each of the third and fourth NMOS transistors being connected to the power supply, the drain of the third NMOS transistor being connected to the commonly connected gate and drain of the second PMOS transistor and to a gate of the first NMOS transistor, and the source of the fourth NMOS transistor being connected to ground,
     - a third PMOS transistor having a source connected to the power supply and a gate and a drain connected together in a weak pull-up configuration with respect to commonly connected gate and drain,
     - a fifth NMOS transistor and a sixth NMOS transistor connected in series by their sources and drains between the commonly connected gate and drain of the third PMOS transistor and ground, a gate of each of the fifth and sixth NMOS transistors being connected to the power supply, the drain of the fifth NMOS transistor being connected to the commonly connected gate and drain of the third PMOS transistor and to a gate of the second NMOS transistor, and the source of the sixth NMOS transistor being connected to ground; and
   - a second control circuit responsive to the output of the control circuit and configured to receive the input signal and to control the voltage at the gates of the second pull-up transistor and the second pull-down transistor to provide the logic level at the output node only when the output of the control circuit has the second logic value.

* * * * *